(12) United States Patent
Lee et al.

(10) Patent No.: US 7,868,401 B2
(45) Date of Patent: Jan. 11, 2011

(54) MULTIBIT ELECTRO-MECHANICAL MEMORY DEVICE HAVING AT LEAST ONE CANTILEVER ELECTRODE AND AT LEAST ONE GATE LINE AND MANUFACTURING METHOD THEREOF

(75) Inventors: Ji-Myoung Lee, Yongin-si (KR); Min-Sang Kim, Seoul (KR); Sung-Min Kim, Incheon (KR); Keun-Hwi Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/289,851

(22) Filed: Nov. 6, 2008

(65) Prior Publication Data
US 2009/0115009 A1    May 7, 2009

(51) Int. Cl.
  *H01L 29/84* (2006.01)
  *H01L 29/76* (2006.01)
  *H01L 21/00* (2006.01)
  *G11C 11/417* (2006.01)
(52) U.S. Cl. .................. 257/415; 257/314; 438/52; 365/164
(58) Field of Classification Search ............... 257/415, 257/314; 438/52; 365/164
See application file for complete search history.

(56) References Cited

U.S. PATENT DOCUMENTS

| | | | |
|---|---|---|---|
| 6,054,745 A * | 4/2000 | Nakos et al. ............ | 257/415 |
| 7,710,768 B2 * | 5/2010 | Naito .................... | 365/164 |
| 2004/0000696 A1 | 1/2004 | Ma et al. | |
| 2005/0037547 A1 * | 2/2005 | Bertin et al. ............ | 438/142 |
| 2006/0087716 A1 | 4/2006 | Kweon et al. | |
| 2008/0048246 A1 * | 2/2008 | Yun et al. ............... | 257/324 |
| 2008/0137404 A1 * | 6/2008 | Park .................... | 365/164 |
| 2008/0144364 A1 * | 6/2008 | Lee et al. ............... | 365/164 |
| 2008/0198649 A1 * | 8/2008 | Park .................... | 365/174 |

FOREIGN PATENT DOCUMENTS

KR    10-0308057    10/2001

* cited by examiner

*Primary Examiner*—N Drew Richards
*Assistant Examiner*—Michael Jung
(74) *Attorney, Agent, or Firm*—Harness, Dickey & Pierce, P.L.C.

(57) ABSTRACT

Provided are a multibit electro-mechanical memory device and a method of manufacturing the same. The device may include at least one bit line in a first direction on a substrate; at least one gate line and at least one lower word line in parallel by a given interval and in a second direction intersecting the first direction on the at least one bit line; at least one contact pad adjacent to the at least one gate line on the at least one bit line; and at least one cantilever electrode coupled to the at least one contact pad, configured to float with a void above and beneath the at least one cantilever electrode and configured to curve in a third direction vertical to the first and second directions.

20 Claims, 17 Drawing Sheets

PROGRAM "0"

READ "0"

PROGRAM "1"

READ "1"

MULTIBIT ELECTRO-MECHANICAL MEMORY DEVICE HAVING AT LEAST ONE CANTILEVER ELECTRODE AND AT LEAST ONE GATE LINE AND MANUFACTURING METHOD THEREOF

PRIORITY STATEMENT

This application claims priority under 35 U.S.C. §119 to Korean Patent Application 10-2007-0112660, filed on Nov. 6, 2007, in the Korean Intellectual Property Office (KIPO), the entire contents of which are hereby incorporated by reference as if fully set forth herein.

BACKGROUND

1. Field

Example embodiments relate to a semiconductor memory device and method of manufacturing the same. Example embodiments also relate to a multibit electro-mechanical memory device and a method of manufacturing the same, which is capable of programming and reading data through a switching operation of multiple cantilever electrodes formed symmetrically on a trench.

2. Description of the Related Art

A memory device of storing data may be largely classified as a volatile semiconductor memory device and a nonvolatile semiconductor memory device. The volatile memory device principally represented as a DRAM (Dynamic Random Access Memory) or SRAM (Static Random Access Memory) may be relatively fast in inputting/outputting data, but may have a shortcoming in that stored contents are lost when a power supply is stopped. The nonvolatile memory device principally provided as EPROM (Erasable Programmable Read Only Memory) or EEPROM (Electrically Erasable Programmable Read Only Memory) may be slow in the input/output operation of data, but may have the merit of maintaining intact the stored data even when a power supply is intercepted.

A memory device may employ a MOSFET (Metal Oxide Semiconductor Field Effect Transistor) based on the technology of MOS (Metal Oxide Semiconductor). For example, a stack gate type transistor memory device having a stack structure on a semiconductor substrate formed of silicon material, and a trench gate type transistor memory device having a structure buried in the semiconductor substrate, are under development. However, a width and length of a channel in the MOSFET must be formed with a given length to suppress a short-channel effect. Further, a thickness of a gate insulating film formed between a gate electrode formed on the channel and the semiconductor substrate must be relatively thin. Due to such disadvantages, there is a difficulty in realizing a memory device with a nano-level ultra microstructure for the MOSFET.

SUMMARY

Example embodiments provide a multibit electro-mechanical memory device and a method of manufacturing the same, which may be capable of realizing a nonvolatile memory device for which a position of a cantilever electrode may not be reset even when a voltage applied from the outside is eliminated. Additionally, a node may be separated on the center of the cantilever electrode and information of 2 bits or more may be input/output.

According to example embodiments, an electro-mechanical memory device may include at least one bit line in a first direction on a substrate; at least one gate line and at least one lower word line in parallel by a given interval and in a second direction intersecting the first direction on the at least one bit line; at least one contact pad adjacent to the at least one gate line on the at least one bit line; and at least one cantilever electrode coupled to the at least one contact pad, configured to float with a void above and beneath the at least one cantilever electrode and configured to curve in a third direction vertical to the first and second directions.

According to example embodiments, a method of manufacturing an electro-mechanical memory device may include forming a bit line on a substrate in a first direction; forming a gate line and a lower word line over the bit line in a second direction; forming a first sacrificial layer on the gate line and the lower word line; forming a contact hole by removing the first sacrificial layer; forming a contact pad within the contact hole; forming a cantilever electrode coupled to the contact pad; forming a second sacrificial layer, trap site and upper word line in the second direction on the cantilever electrode; and producing a void in upper and lower parts of the cantilever electrode by removing the first and second sacrificial layers.

According to example embodiments, a method of manufacturing a multibit electro-mechanical memory device may include forming a bit line on a substrate in a first direction; forming a first interlayer insulating film on the bit line; forming a gate line, a lower word line, and a second interlayer insulating film on the first interlayer insulating film in a second direction; forming a first sacrificial layer on the substrate; forming a contact hole by removing the first sacrificial layer formed on the bit line intersecting the second interlayer insulating film adjacent to the gate line, the second interlayer insulating film and the first interlayer insulating film; forming a contact pad within the contact hole; forming a cantilever electrode on the contact pad in the first direction; forming a second sacrificial layer, a trap site and an upper word line on the cantilever electrode in the second direction; forming a third interlayer insulating film in a sidewall of the second sacrificial layer, the trap site and the upper word line; forming a trench by removing the center of the upper word line, trap site, second sacrificial layer, cantilever electrode, first sacrificial layer and lower word line; and forming a void by removing the first and second sacrificial layers.

According to example embodiments, a given amount of charge may be trapped in the first and second trap sites on the cantilever electrode, and the first and second cantilever electrodes may be maintained in a curved state. In addition, in a multibit electro-mechanical memory device according to example embodiments, a bit line electrically coupled to the cantilever electrode may be formed in a direction of the cantilever electrode in a lower part of the lower word line, and a node of cantilever electrode formed on the lower word line may be separated to input and output information of 2 bits.

BRIEF DESCRIPTION OF THE DRAWINGS

Example embodiments will be more clearly understood from the following detailed description taken in conjunction with the accompanying drawings. FIGS. 1-17B represent non-limiting, example embodiments as described herein.

FIG. 1 is a perspective view of multibit electro-mechanical memory device according to example embodiments;

FIG. 2 is a sectional view taken along a line I~I' of FIG. 1;

FIG. 3 is a sectional view showing a stacked structure of multibit electro-mechanical memory devices shown in FIG. 2;

FIGS. 4A to 5B are sectional views providing information write or information read operation in a multibit electro-mechanical memory device according to example embodiments; and FIGS. 6A to 17B are sectional views of processes to manufacture a multibit electro-mechanical memory device according to example embodiments.

Figure 1:
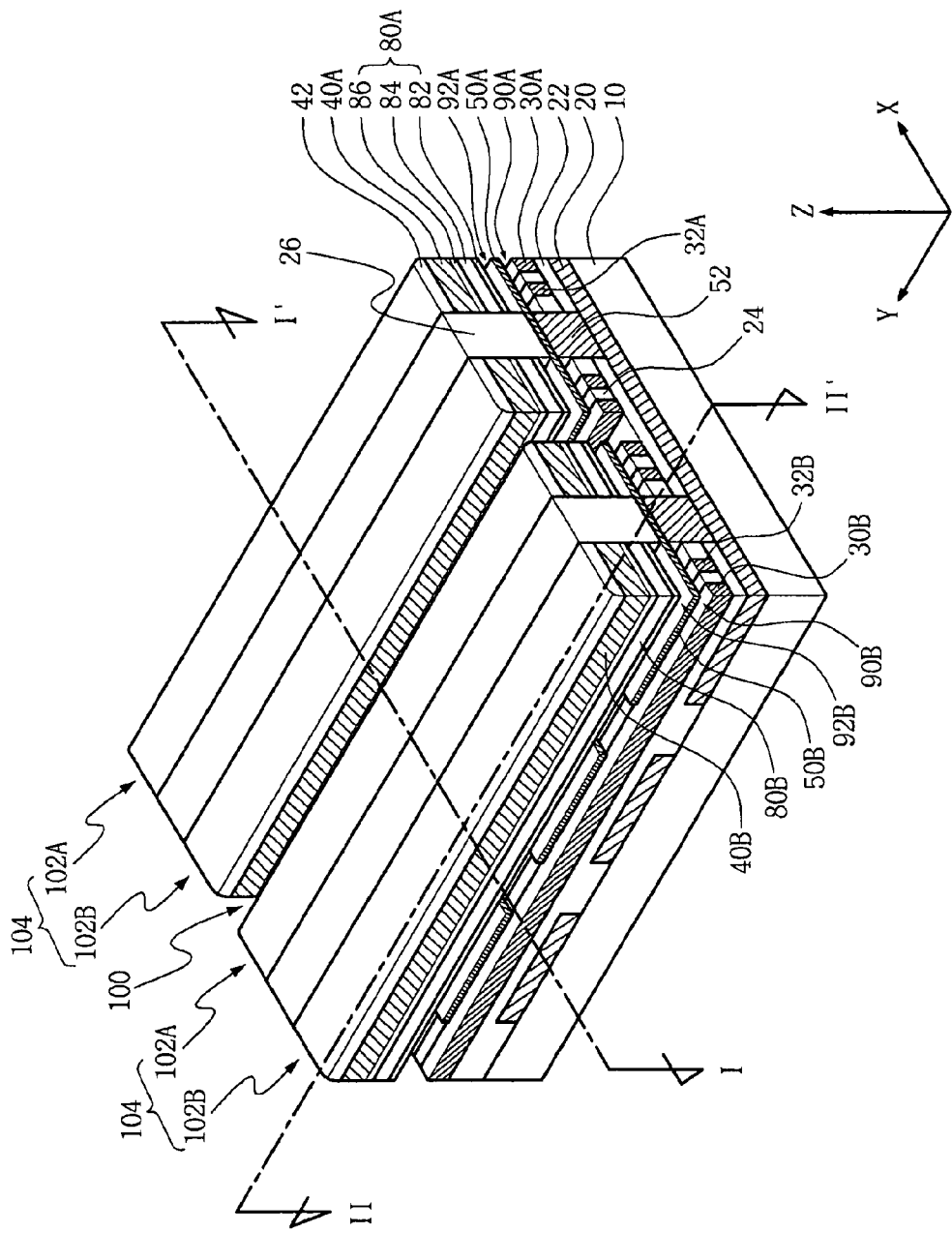

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
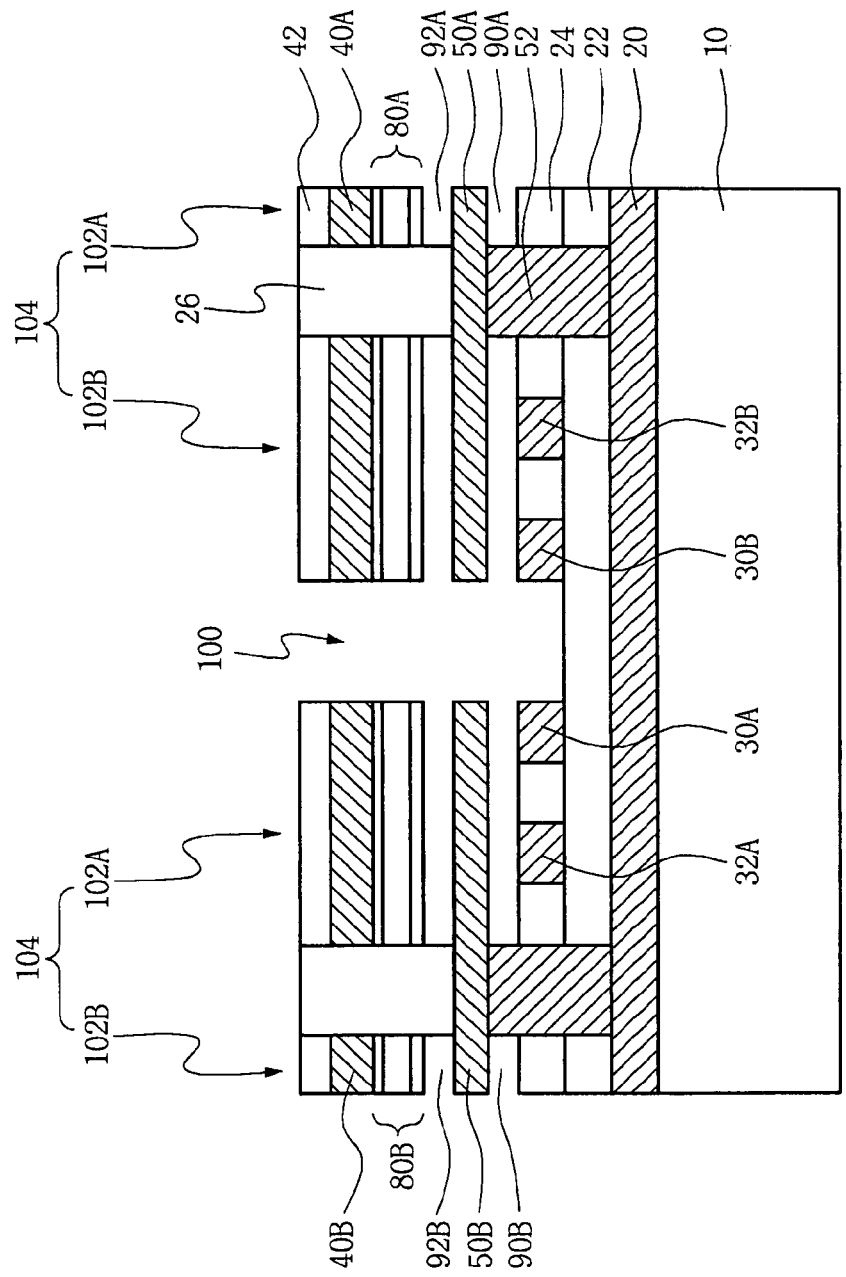

FIG. 1 is a perspective view of multibit electro-mechanical memory device according to example embodiments, and FIG. 2 is a sectional view taken along a line I~I' of FIG. 1.

Referring to FIGS. 1 and 2, a plurality of bit lines 20 may be formed in a first direction on a substrate 10 with a given flat face. For example, the substrate 10 may be formed including a semiconductor substrate or an insulation substrate having a dominant flexibility. The plurality of bit lines 20 may be formed including at least one of a conductive metal material and a crystal silicon or polysilicon material doped with a conductive impurity, the conductive metal material being gold, silver, copper, aluminum, tungsten, tungsten silicide, titanium, titanium nitride, tantalum, or tantalum silicide. A first interlayer insulating film 22 may be formed on the plurality of bit lines 20. For example, the first interlayer insulating film 22 may be a dielectric electrically insulating the plurality of bit lines 20, and may be formed containing silicon oxide or silicon oxide nitride.

First and second lower word lines 30A and 30B and first and second gate lines 32A and 32B, separated in the second direction on both sides through a trench 100, may be symmetrically formed on the first interlayer insulating film 22. The first lower word line 30A, the second lower word line 30B, the first gate line 32A and the second gate line 32B may be insulated from the substrate 10 and the plurality of bit lines 20 through the first interlayer insulating film 22. Thus, the first lower word line 30A, the second lower word line 30B, the first gate line 32A and the second gate line 32B may freely receive an electrical signal applied from the bit lines 20. For example, the first and second lower word lines 30A and 30B and the first and second gate lines 32A and 32B may be formed of a dominant conductive metal material, e.g., gold, silver, copper, aluminum, tungsten, tungsten silicide, titanium, titanium nitride, tantalum, or tantalum silicide.

The first lower word line 30A, the first gate line 32A, the second lower word line 30B and the second gate line 32B may be individually electrically isolated from each other through a second interlayer insulating film 24. Similarly, the second interlayer insulating film 24 may be formed of silicon oxide, silicon nitride, or silicon oxide nitride. Though not shown in the drawings, a plurality of spacers may be formed instead of the second interlayer insulating film 24.

On an adjacent area of the first and second gate lines 32A and 32B opposite to the first and second lower word lines 30A and 30B, a contact pad 52 may be formed. The contact pad 52 may protrude over the height of the second interlayer insulating film 24. The contact pad 52 may be formed including a dominant conductive metal material, e.g., gold, silver, copper, aluminum, tungsten, tungsten silicide, titanium, titanium nitride, tantalum or tantalum silicide.

The contact pad 52 may support a first cantilever electrode 50A and a second cantilever electrode 50B. The first cantilever electrode 50A and the second cantilever electrode 50B may be formed symmetrically, being provided with first and second lower voids 90A and 90B thereunder, and supported by the contact pad 52. The first and second cantilever electrodes 50A and 50B may be adapted, passing through an upper part of first and second gate lines 32A and 32B and being extended to an upper part of the first and second lower word lines 30A and 30B.

For example, the first and second cantilever electrodes 50A and 50B may be formed in a first direction, e.g., X-axis direction. Further, the first and second cantilever electrodes 50A and 50B may be curved to contact the first and second lower word lines 30A and 30B by an electrostatic force produced from an electrical field induced within the first and second lower voids 90A and 90B.

For example, when a given amount of charge having mutually different polarities is applied individually to the first cantilever electrode 50A and the first lower word line 30A, and the second cantilever electrode 50B and the second lower word line 30B, the first and second cantilever electrodes 50A and 50B may be curved by an electrostatic force corresponding to an attractive force in a third direction, e.g., Z-axis direction. Similarly, when a given amount of charge is applied individually to the first and second cantilever electrodes 50A and 50B, and the first and second gate lines 32A and 32B; the first and second cantilever electrodes 50A and 50B may be curved in a third direction.

Accordingly, the first and second cantilever electrodes 50A and 50B may be curved upward and downward above the first and second lower word lines 30A and 30B. For example, the first and second cantilever electrodes 50A and 50B may be formed of titanium, titanium nitride or carbon nanotube material. The titanium and the titanium nitride may not be easily oxidized even though exposed to air through the first and second lower voids 90A and 90B, and may not be transformed even though the first and second cantilever electrodes 50A and 50B has a given level of curvature, as conductive metal having an elastic force more than a plasticity/elasticity coefficient.

The carbon nanotube may have a tube shape, where six-sided shapes each constructed of 6 carbon atoms may be associated with one another, and a diameter of the tube may be just several nanometers. Additionally, in the carbon nanotube, an electrical conduction may be similar to copper, heat conduction may be the same as diamond, and the stiffness may be 100 times more than steel. Carbon fiber may be cut against the transformation of even about 1%, but a carbon nanotube may have a restoring force to endure the transformation of about 15%.

A first cantilever electrode 50A and a second cantilever electrode 50B may be formed in a first direction, e.g., X-axis direction, interposing the pad electrode 52 therebetween, the first and second cantilever electrodes 50A and 50B being formed suspending with first and second lower voids 90A and 90B formed on the first and second lower word lines 30A and 30B. The first and second cantilever electrodes 50A and 50B may be supported by the contact pad 52, and the second interlayer insulating film 24 or spacer formed in both sides of the contact pad 52.

In the first and second trap sites 80A and 80B, a charge applied through the first and second lower word lines 30A and 30B may be tunneled inside thereof and may be trapped therein so that the trapped charge may be held even when there is no charge applied from the outside. For example, the first and second trap sites 80A and 80B may include a thin film with a ONO (Oxide-Nitride-Oxide) structure, wherein a first silicon oxide 82, formed on the first and second lower word lines 30A and 30B, silicon nitride 84 and second silicon oxide 86 are stacked. Further, first and second upper word lines 40A and 40B may be formed of a conductive metal material having a dominant conduction, e.g., gold, silver, copper, aluminum, tungsten, tungsten silicide, titanium, titanium nitride, tantalum, or tantalum silicide.

On the other hand, when a charge is applied to the first and second upper word lines 40A and 40B, the charge may be tunneled and trapped in the first and second trap sites 80A and 80B. The first and second cantilever electrodes 50A and 50B may be curved upward so that the tip of the first and second cantilever electrodes 50A and 50B is in contact with the first and second trap sites 80A and 80B by an electrical field induced by the charge applied to the first and second upper word lines 40A and 40B and the charge trapped by the first and second trap sites 80A and 80B.

Even when charge applied to the first and second upper word lines 40A and 40B and to the first and second cantilever electrodes 50A and 50B is eliminated, the first and second cantilever electrodes 50A and 50B may be maintained in the curved state. For example, the tip of the first and second cantilever electrodes 50A and 50B may be kept in contact with the first and second trap sites 80A and 80B by an electrical field induced by the charge trapped by the first and second trap sites 80A and 80B. A charge having a polarity opposite to the charge trapped by the first and second trap sites 80A and 80B may be concentrated and induced onto the tip of the first and second cantilever electrodes 50A and 50B, and an electrostatic attraction may act thereon. Thus, the first and second cantilever electrodes 50A and 50B may be maintained in the curved state.

In the multibit electro-mechanical memory device according to example embodiments, a curved state of the first and second cantilever electrodes 50A and 50B may be maintained by using the first and second trap sites 80A and 80B to trap a charge, thereby realizing a nonvolatile memory device. A third interlayer insulating film 26 may be formed on the contact electrode 52 with the first and second cantilever electrodes interposed therebetween so as to insulate the first and second trap sites from each other and to insulate the first and second upper word lines from each other. For example, the third interlayer insulating film 26 may be formed of silicon oxide, silicon nitride, or silicon oxide nitride.

Though not shown in the drawings, the first and second lower voids 90A and 90B, and the first and second upper voids 92A and 92B, may be spaces formed by removing a first sacrificial layer (60 of FIG. 10A) and a second sacrificial layer (70 of FIG. 14A) exposed to the trench 100. Further, the voids may be the space through which each tip of the first and second cantilever electrodes 50A and SOB moves in a third direction, e.g., Z-axis direction, perpendicular to the substrate 10.

Accordingly, the multibit electro-mechanical memory device may include a unit cell 104 that includes first and second memory units 102A and 102B separated from each other on the trench 100, or separated from each other/both sides on the contact pad 52. The first and second memory units 102A and 102B adjacent mutually in a first direction, e.g., X-axis direction, may electrically share one of the plurality of bit lines 20. The first and second memory units 102A and 102B of each unit cell 104 adjacent mutually in second direction, e.g., Y-axis direction, may electrically share the first lower word line 30A or second lower word line 30B, and may electrically share the first or second upper word line 40A or 40B.

Each unit cell 104 includes the first and second memory units 102A and 102B, and the first and second cantilever electrodes 50A and 50B of the first and second memory units 102A and 102B separately perform a switching operation, which makes it possible inputting or outputting data of two bits or more per unit cell 104.

The first and second upper word lines 40A and 40B, to which an electrical signal to switch the first and second cantilever electrodes 50A and 50B is applied, may be formed of a conductive metal material having a relatively low resistance compared with a polysilicon material, thus reducing power consumption and increasing throughput.

A hard mask layer 42 may be stacked on top of each upper word line.

Figure 3:
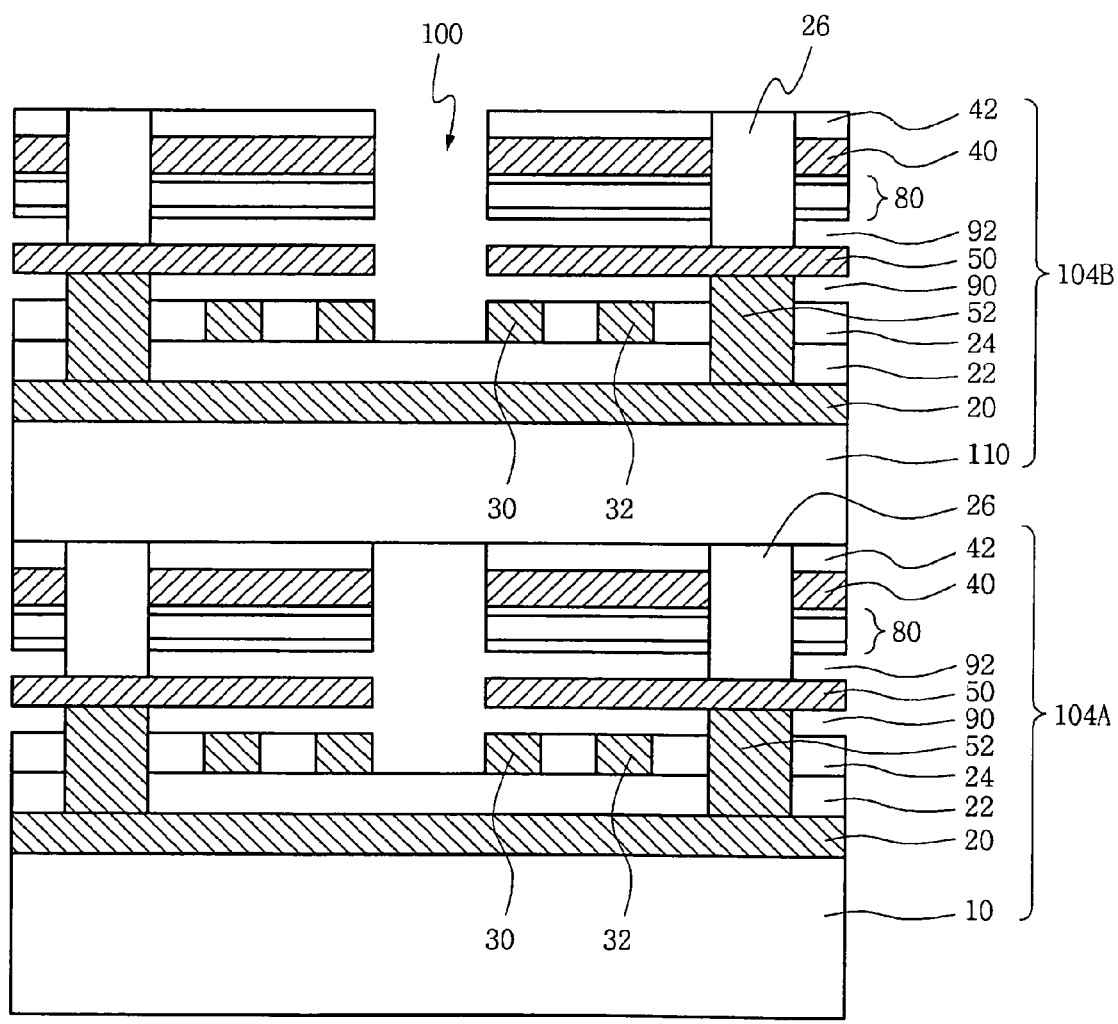

FIG. 3 is a sectional view showing a stacked structure of multibit electro-mechanical memory devices shown in FIG. 2. As shown in FIG. 3, a multibit electro-mechanical memory device according to example embodiments may be configured in a stacked structure of the first unit cell 104A and the second unit cell 104B on a fourth interlayer insulating film 110 formed on the first unit cell 104A. The inside of the trench 100 of the first and second unit cells 104A and 104B may have a vacuum state in which the cantilever electrode 50 may move upward and downward, or may be filled with a non-reactive gas, e.g., nitrogen gas or argon gas. The fourth interlayer insulating film 110 may be formed covering an upper part of the first unit cell 104A, to distinguish the first unit cell 104A from the second unit cell 104B.

The fourth interlayer insulating film 110 may be formed of, for example, a polymer material. During forming the fourth interlayer insulating film, the material of the fourth interlayer insulating film should not flow into the trench 100. Though not shown in the drawing, a bit line 20 of the first unit cell 104A and a bit line 20 of the second unit cell 104B may be formed to have mutually different directions, or the trench 100 of the second unit cell 104B need not necessarily overlap the trench 100 of the first unit cell 104A.

Thus, the multibit electro-mechanical memory device according to example embodiments may have a stack structure of the second unit cell 104B, the fourth interlayer insulating film 110, and the first unit cell 104A formed on the substrate 10, thus increasing an integration of memory devices.

An operating method of multibit electro-mechanical memory device according to example embodiments may be described as follows. The first and second gate lines 32A and 32B, the first and second lower word lines 30A and 30B, the first and second cantilever electrodes 50A and 50B, and the first and second upper word lines 40A and 40B may be each described herein as gate line 32, lower word line 30, cantilever electrode 50 and upper word line 40, and also reference characters and numbers therefor may be used together. The first and second lower voids 90A and 90B may be described herein as lower void 90, and the first and second upper voids 92A and 92B as upper void 92. Further, the lower and upper voids 90 and 92 may be all described herein as void 94, and reference characters and numbers therefor may be changed in the following description.

In the multibit electro-mechanical memory device according to example embodiments, given information (data) may be programmed, deleted, recorded or read out according to a position of the cantilever electrode 50. For example, when there is no electrical field induced within the void 94, the cantilever electrode 50 may be supported horizontally at a height the same as or similar to the contact pad 52. On the other hand, when an electrical field of a given intensity may be induced in the void 94, a charge of a given intensity may be concentrated on a tip of the cantilever electrode 50 by the electrical field. Thus, the cantilever electrode 50 may be curved into a third direction vertical to the substrate 10. Program, delete, program and readout may be performed by a switching operation where the tip of the cantilever electrode 50 may contact or be separated from the lower word line 30 or trap site 80.

Program, delete and readout operations of each of first and second memory units 102A and 102B constituting the unit cell 104 may be individually performed by controlling the voltage applied to each of the bit line 20, lower word line 30 and upper word line 40. For example, when a voltage difference of a given level or more between the first lower word line 30A and the first upper word line 40A is generated, data corresponding to "0" or "1" may be programmed in the first memory unit 102A. Similarly, when a voltage difference of a given level or more between the second lower word line 30B and the second upper word line 40B is generated, data corresponding to "0" or "1" may be programmed in the second memory unit 102B. The first and second memory units 102A and 102B may be programmed with the same or mutually opposite data.

The unit cell 104 of the multibit electro-mechanical memory device according to example embodiments may program combination information corresponding to "0" or "1" in the first and second memory units 102A and 102B. The first and second memory units 102A and 102B may electrically share one bit line 20, and thus, respective program and read operations may not be simultaneously performed. Further, any one of the first and second memory units 102A and 102B may use the bit line 20 at a given time.

Thus, in the multibit electro-mechanical memory device according to example embodiments, data of 2 bits may be programmed in a single cell comprised of the first and second memory units 102A and 102B, which are programmed to have the same or different state. The first and second memory units 102A and 102B may be symmetrical to each other on both sides of the trench 100 or contact pad 52.

As described above, when charge having a polarity opposite to a charge applied to the upper word line 40 and trap site 80 is applied, the cantilever electrode 50 may curve to be in contact with the trap site 80 by an electrostatic force acting as an attractive force. On the other hand, when a charge having the same polarity as a charge applied to the upper word line 40 and trap site 80 is applied, the cantilever electrode 50 may be separated from the trap site 80 by an electrostatic force acting as a repulsive force. In order for the cantilever electrode 50 to be curved towards the trap site 80, the cantilever electrode 50 should resist elasticity or restoring force thereof. The elastic force or restoring force generally depends upon Hook's law proportionate to a movement distance, and the electrostatic force may be based on Coulomb's force proportionate to the square of movement distance.

Figure 4A:
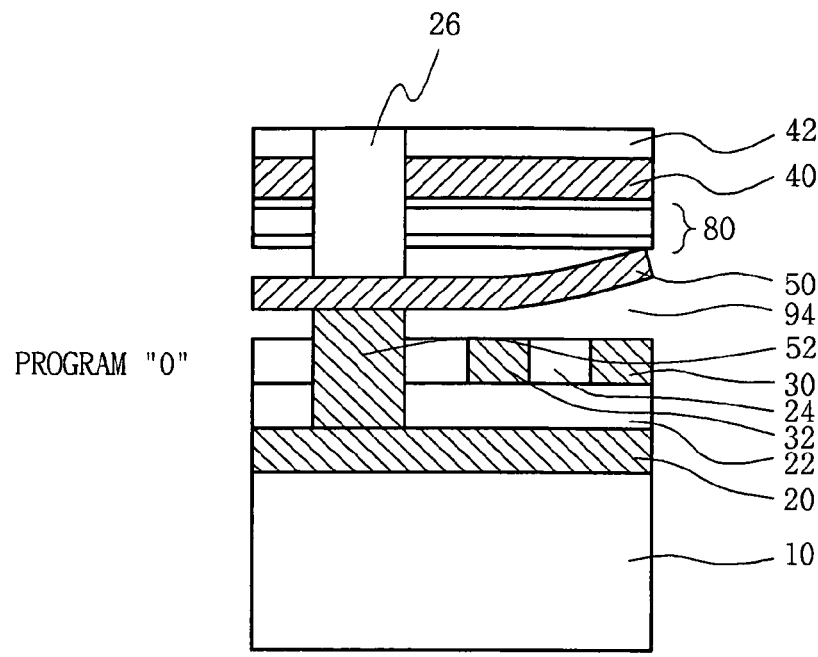

FIGS. 4A to 5B are sectional views providing information write or information read operation in a multibit electro-mechanical memory device according to example embodiments. To program information corresponding to "0", a first voltage, e.g., $V_{pull-in}$, of given strength may be applied between the upper word line 40 and the bit line 20. Thus, the tip of cantilever electrode 50 may contact the trap site 80 as shown in FIG. 4A.

Figure 4B:
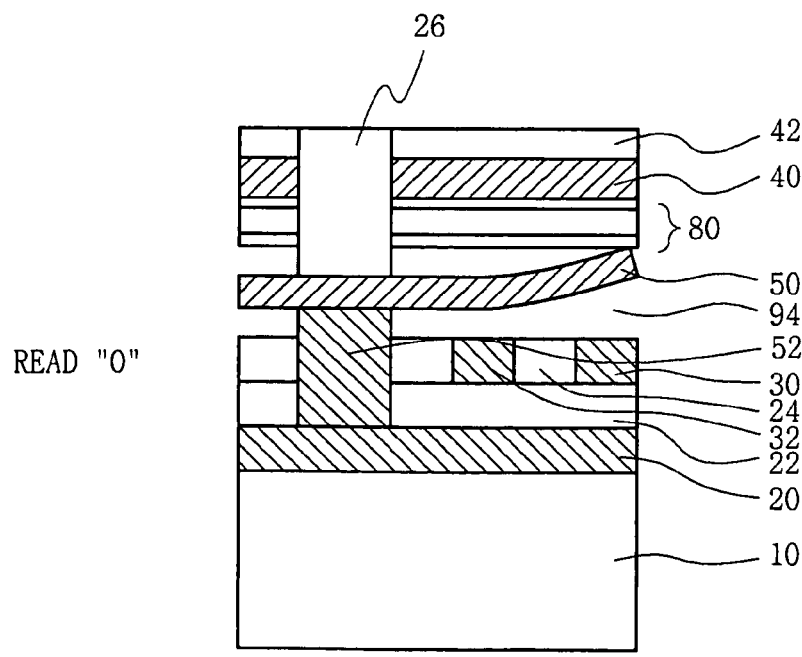

Further, to read out information corresponding to "0", the cantilever electrode 50 maintains contact with the trap site 80 as shown in FIG. 4B. A second voltage induced between bit line 20 and upper word line 40, and a third voltage induced between the bit line 20 and the lower word line 30, may be compared, and when the second voltage is greater, data corresponding to '0' may be read out. A distance between the cantilever electrode 50 electrically connected to the bit line 20 and the upper word line 40 may be shorter than a distance between the cantilever electrode 50 and the lower word line 30 and the voltage magnitude may be proportionate to an inverse number of the distance. A voltage applied to the gate line 32 may have sufficient magnitude not to resist attractiveness between the cantilever electrode 50 and the trap site 80 in the readout of information corresponding to "0".

Figure 5A:
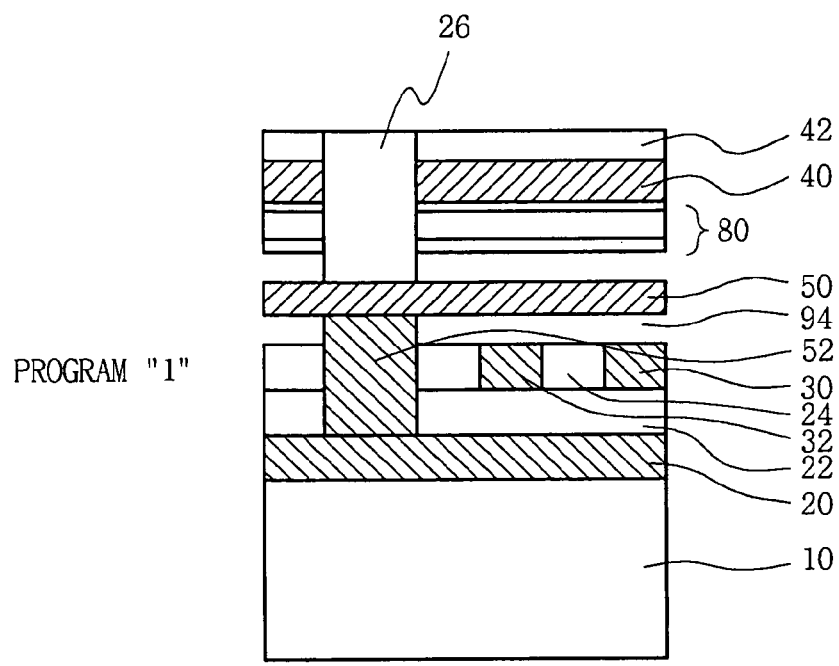

On the other hand, to program information corresponding to "1", a fourth voltage, e.g., $V_{pull-out}$, of given strength may be applied between the lower word line 30 and the bit line 20. Thus, the tip of the cantilever electrode 50 may be separated from the trap site 80 and the cantilever electrode 50 may be in a horizontal state as shown in FIG. 5A. When the tip of the cantilever electrode 50 has been already separated from the trap site 80, the fourth voltage may not be applied.

Figure 5B:
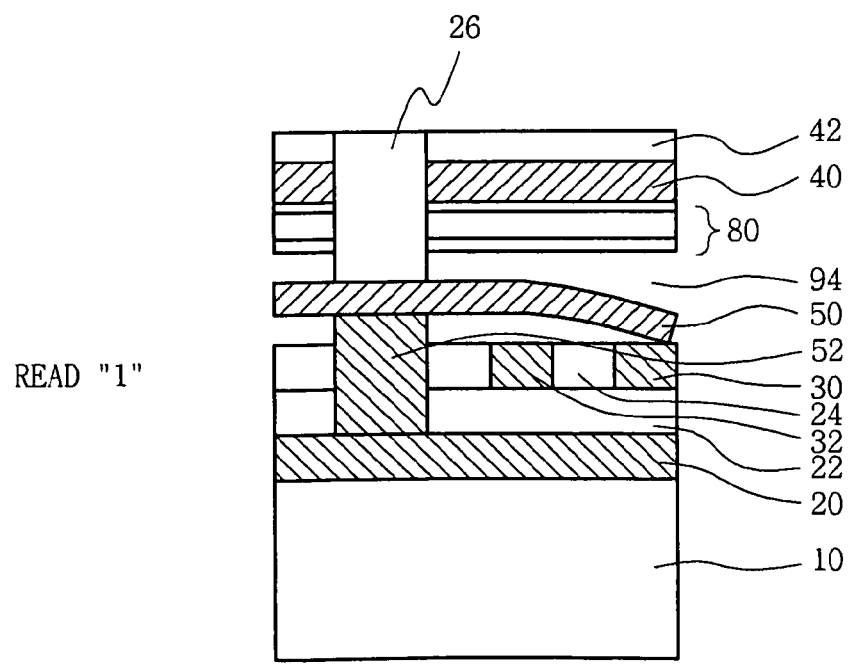

Further, second voltage induced to between the bit line 20 and the upper word line 40, and the third voltage induced to between the bit line 20 and the lower word line 30, may be compared, and when the third voltage may be greater than the second voltage, data corresponding to '1' may be read out. When the third voltage is more than a given level, the cantilever electrode 50 may be electrically in contact with the lower word line 30 as shown in FIG. 5B. In a multibit electro-mechanical memory device according to example embodiments, when the cantilever electrode 50 contacts the lower word line 30, a voltage drop may be generated and data corresponding to '1' may be read out.

When the third voltage induced between the bit line 20 and the lower word line 30 is more than a given level, the cantilever electrode 50 may melt by a generation f heat on a contact portion between the cantilever electrode 50 and the lower word line 30, causing a short-circuit. Therefore, a fifth voltage may be applied between the cantilever electrode 50 and the gate line 32 so that the cantilever electrode 50 becomes easily curved toward the direction of the lower word line 30, thereby reducing the magnitude of the third voltage. The third voltage may be reduced by increasing the fifth voltage. In addition, as the level of the third voltage is reduced, the corresponding current may be reduced.

In the multibit electro-mechanical memory device according to example embodiments, the fifth voltage may be applied between the gate line 32 and the cantilever electrode 50 so as to reduce a voltage difference between the bit line 20 and the lower word line 30. As a result, the amount of heat released from the contact portion of the cantilever electrode 50 and the lower word line 30 is substantially reduced and power consumption is also reduced. A charge applied to the gate line 32 and the word line 30 may have the same polarity.

A method of manufacturing a multibit electro-mechanical memory device according to example embodiments may be described as follows. FIGS. 6A to 17B are sectional views of processes to manufacture a multibit electro-mechanical memory device according to example embodiments. FIGS. 6A to 17A are sectional views of sequential processes taken along a line I~I' of FIG. 1 and FIGS. 6B to 17B are sectional views of sequential processes taken along a line II~II' of FIG. 1.

Figure 6A:
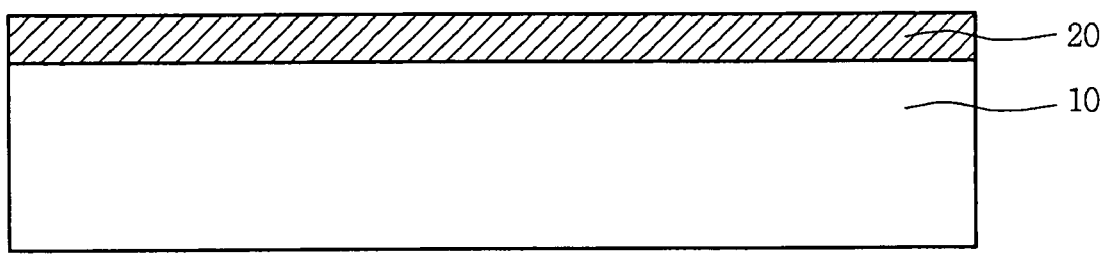
Figure 6B:
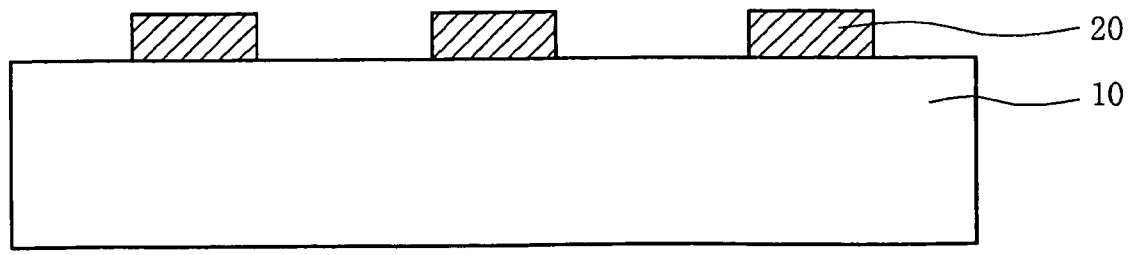

As shown in FIGS. 6A and 6B, a bit line 20 with a given thickness may be formed in a first direction on a substrate 10 of a horizontal state. For example, a plurality of bit lines 20 may be formed in parallel in the first direction on the substrate 10. For example, the bit line 20 may include a conductive metal film, e.g., gold, silver, copper, aluminum, tungsten, tungsten silicide, titanium, titanium nitride, tantalum, tantalum silicide formed by a physical vapor deposition (PVD) or chemical vapor deposition (CVD), or a polysilicon film or crystal silicon film doped with a conductive impurity. Though not shown in the drawing, the bit line 20 may be formed by aeolotropically etching the conductive metal layer or the polysilicon layer formed with a given thickness on an entire face of the substrate 10 through a dry etching method that uses a photoresist pattern or first hard mask layer (not shown) as an etch mask layer, the photoresist pattern or first hard mask layer being for shielding thereon to produce a given line width. For example, a reactive gas used for the dry etching method of the conductive metal layer or polysilicon layer may contain a strong acid gas obtained by a mixture of HF, fluorosulfuric acid, sulphuric acid and nitric acid. The bit line 20 may be formed to have the thickness of about 200 Å and a line width of about 50 Å.

Figure 7A:
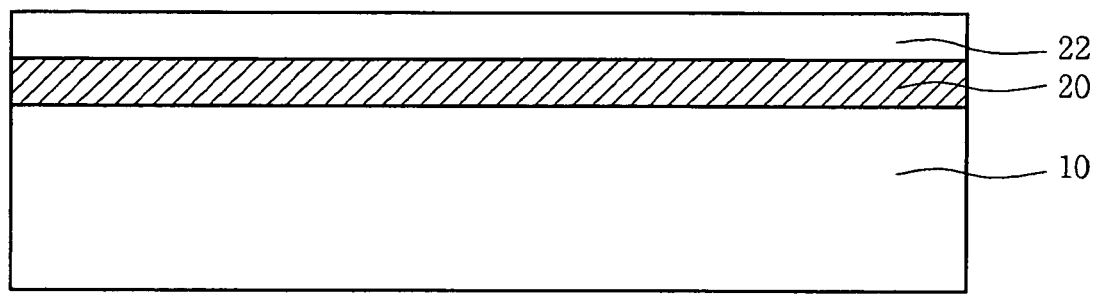
Figure 7B:
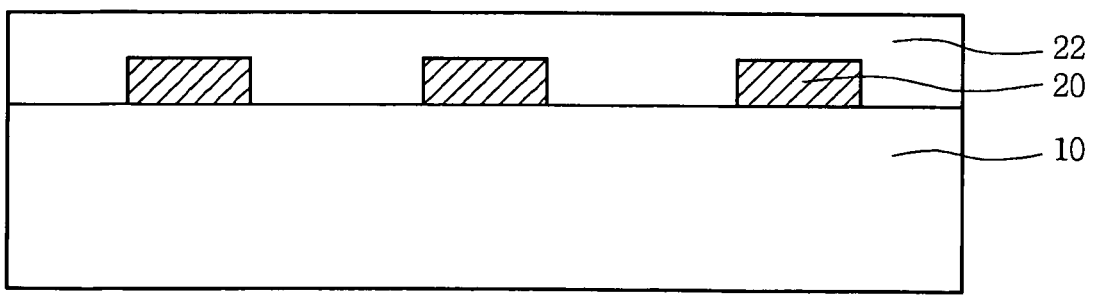

As shown in FIGS. 7A and 7B, a first interlayer insulating film 22 of a given thickness may be formed on an entire face of the substrate 10 where the bit line 20 has been formed. The first interlayer insulating film 22 may electrically insulate the bit line 20 formed on the substrate 10 from the lower word line 30 to be formed subsequently, and furthermore, may function as an etch stop layer in the formation process of the trench 100 that separates the lower word line 30 in the second direction. For example, the first interlayer insulating film 22 may be formed of silicon oxide or silicon nitride to have a thickness of about 200 Å through about 800 Å.

Figure 8A:
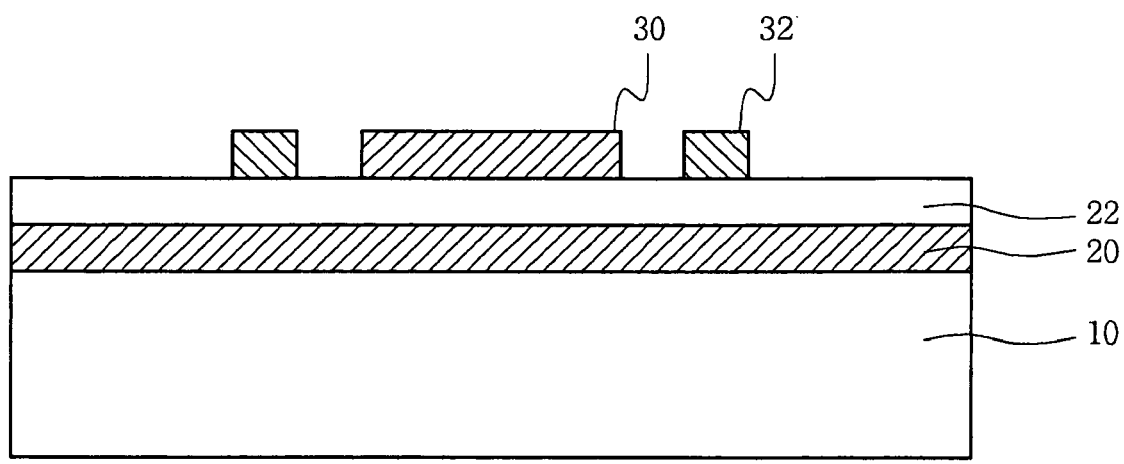
Figure 8B:
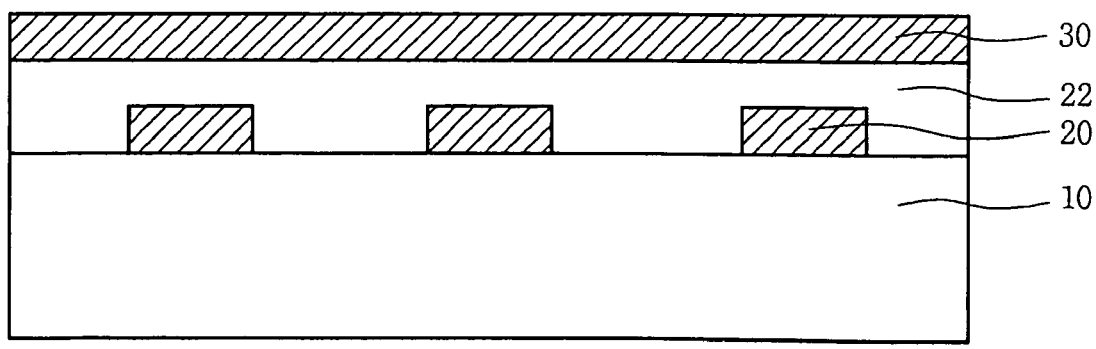

As shown in FIGS. 8A and 8B, the gate line 32 and the lower word line 30 with a given line width may be formed on the first interlayer insulating film 22 in the second direction intersecting with the bit line 20. The gate line 32 and the lower word line 30 may be formed in parallel with each other with each given thickness on the first interlayer insulating film 22. For example, the gate line 32 and the lower word line 30 may be formed through physical vapor deposition (PVD) or chemical vapor deposition (CVD), including a conductive metal layer having a dominant conductivity, e.g., gold, silver, copper, aluminum, tungsten, tungsten silicide, titanium, titanium nitride, tantalum, or tantalum silicide, with a thickness of about 200 Å. The gate line 32 and the lower word line 30 may be formed through a dry etching method which uses, as an etch mask, a photoresist pattern or a second hard mask layer (not shown) selectively shielding the conductive metal layer formed on the first interlayer insulating film 22. The photoresist pattern or second hard mask layer (not shown) may be removed through a wet or dry etching method.

Figure 9A:
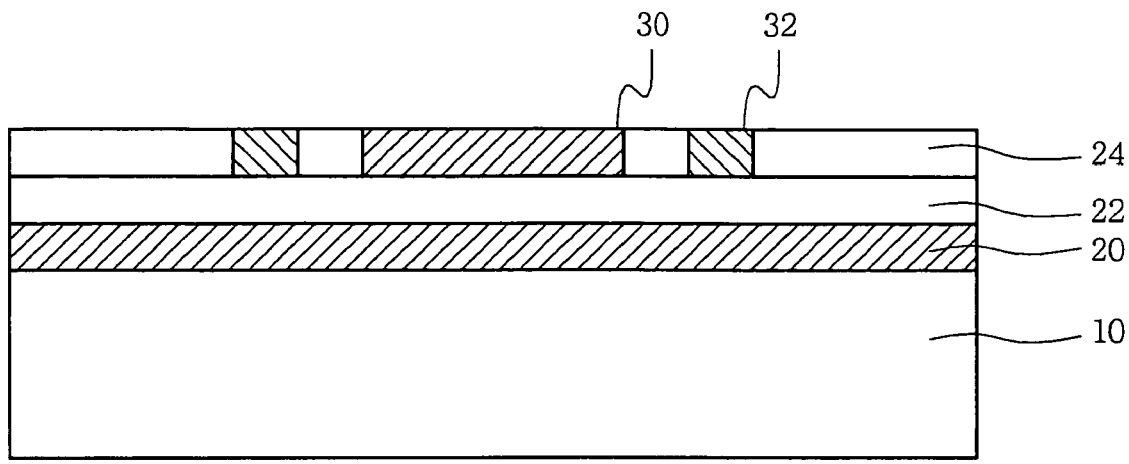
Figure 9B:
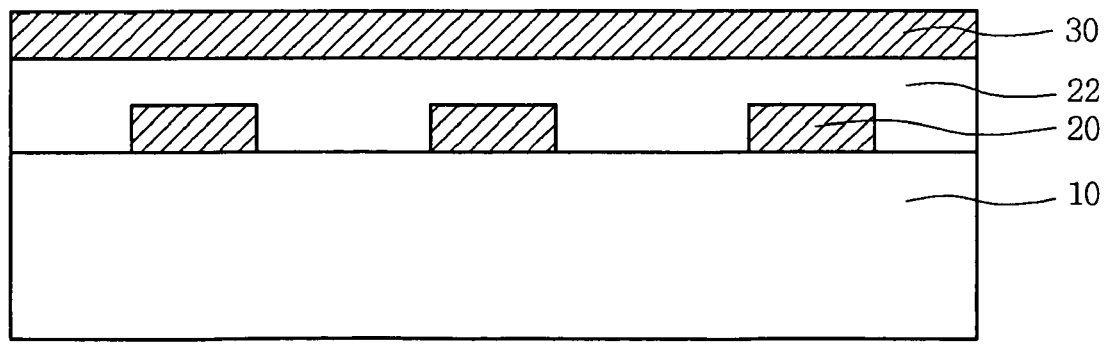

As shown in FIGS. 9A and 9B, a second interlayer insulating film 24 may be formed between the gate line 32 and the lower word line 30. The second interlayer insulating film 24 may be formed on the substrate 10 on which the gate line 32 and the lower word line 30 have been formed. The second interlayer insulating film 24 may be planarized to expose the top surfaces of the gate line 32 and the lower word line 30. Thus, the second interlayer insulating film 24 may insulate the gate line 32 and the lower word line 30 from each other.

Although not shown in the drawings, the second interlayer insulating film 24 of a uniform thickness may be formed on an entire face of the substrate 10 including the gate line 32 and the lower word line 30, and may be anisotropically etched to form a spacer selectively surrounding each sidewall of the gate line 32 and the lower word line 30.

On the other hand, after the second interlayer insulating film 24 is formed, the gate line 32 and the lower word line 30 may be formed. For example, the second interlayer insulating film 24 may be formed on the first interlayer insulating film 22, and the second interlayer insulating film 24 may be selectively removed, thereby forming a groove to which the first interlayer insulating film 22 is selectively exposed. A conductive metal layer filling the groove may be formed, removed and planarized in order to expose the second interlayer insulating film 24, thereby forming the gate line 32 and the lower word line 30.

Figure 10A:
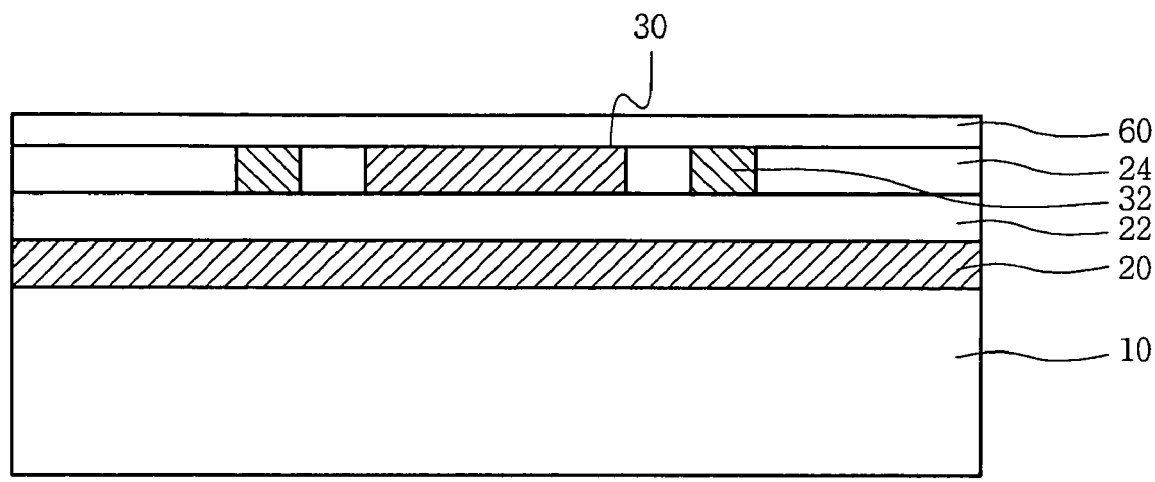
Figure 10B:
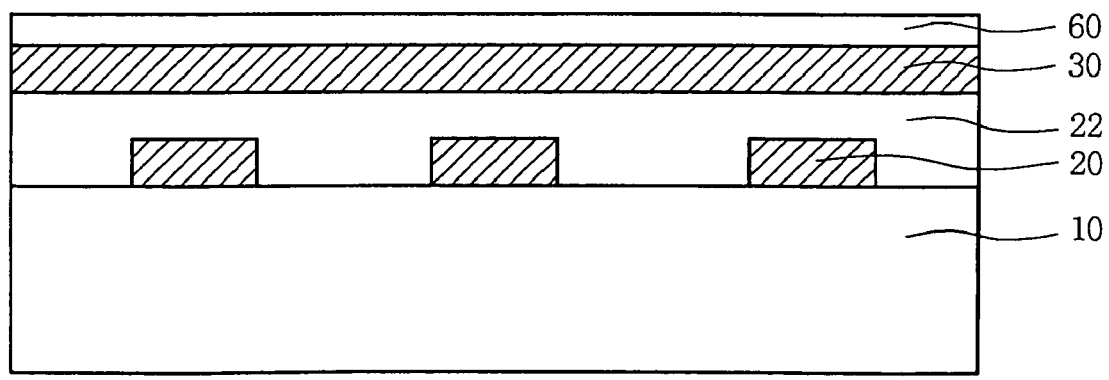

With reference to FIGS. 10A and 10B, a first sacrificial layer 60 of given thickness may be formed on the gate line 32, the lower word line 30 and the second interlayer insulating film 24. The first sacrificial layer 60 may be formed of polysilicon material through atomic layer deposition or CVD, with a thickness of about 50 Å to about 150 Å.

Figure 11A:
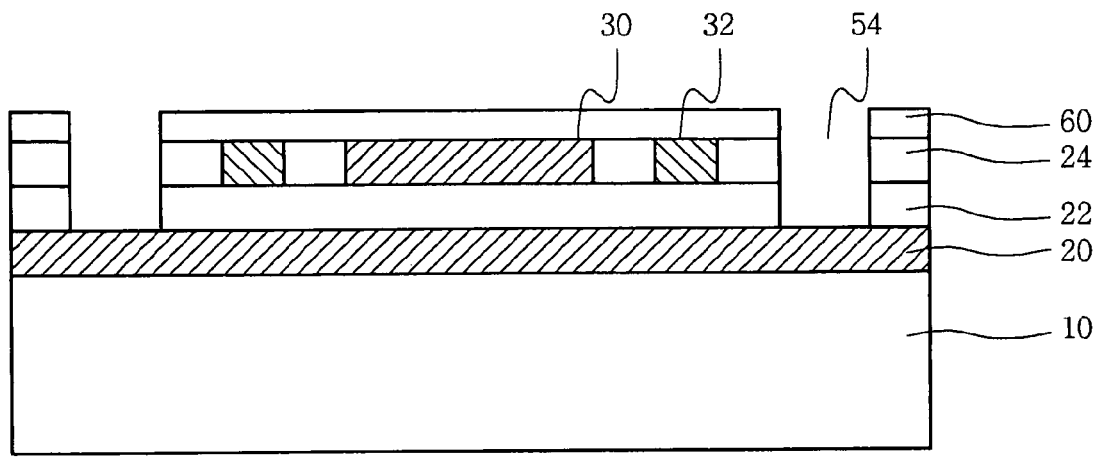
Figure 11B:
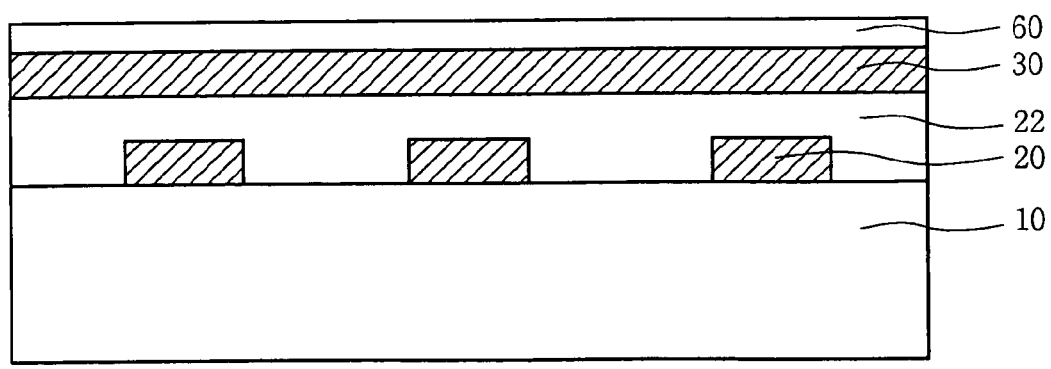

Referring to FIGS. 11A and 11B, the first sacrificial layer 60, second interlayer insulating film 24 and first interlayer insulating film 22 between the plurality of gate lines 32 may be removed, thus forming a contact hole 54 selectively exposing the bit line 20. The contact hole 54 may be formed by using a dry etching method via an etch mask or a photoresist pattern is formed on the first sacrificial layer 60 to expose portions of the first sacrificial layer 60 between the plurality of gate lines 32.

Figure 12A:
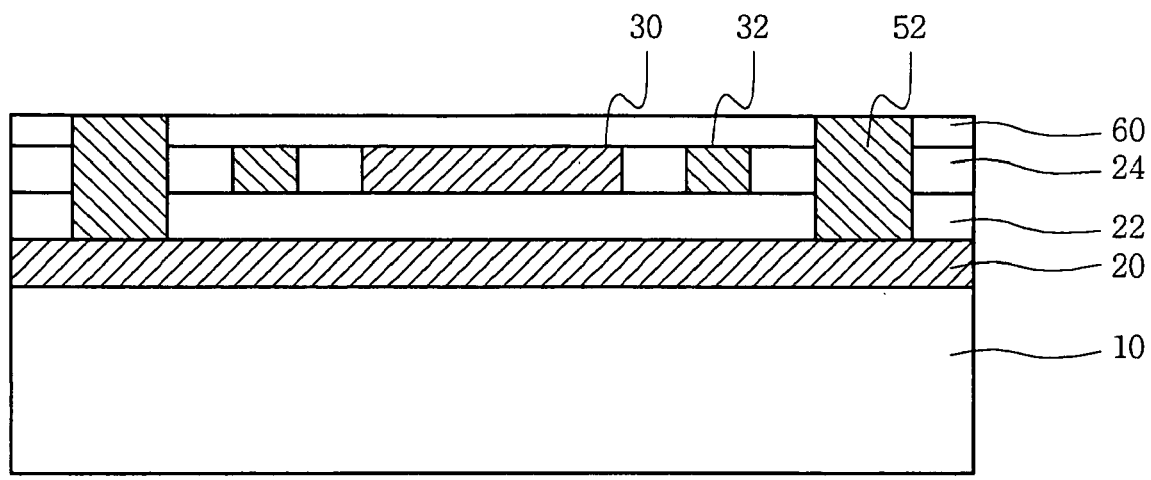
Figure 12B:
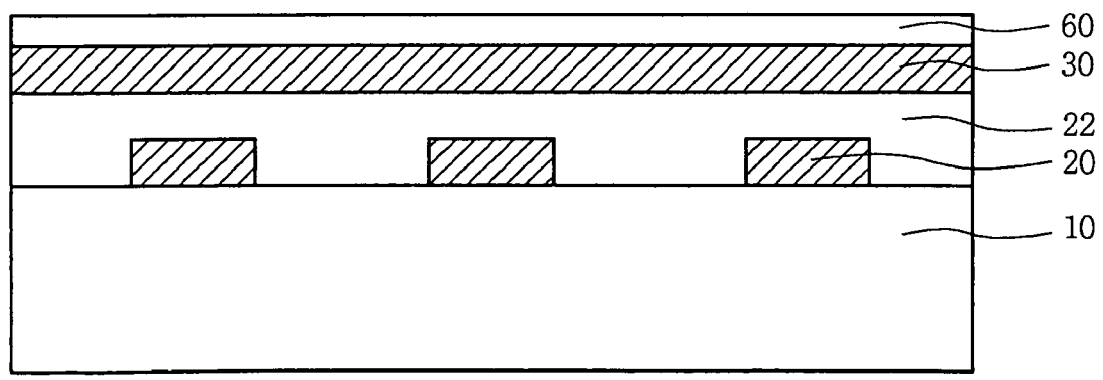

As shown in FIGS. 12A and 12B, a contact pad 52 filling the contact hole 54 may be formed. The contact pad 52 may be electrically connected to the bit line 20 exposed through the contract hole 54. Though not shown in the drawing, at least one conductive layer, e.g., titanium or titanium nitride layer, may further be formed to produce an ohmic contact between the bit line 20 and the contact pad 52. For example, the contact pad 52 may be produced by forming a conductive metal layer of given thickness filling the contact hole 54 through PVD or CVD and by removing and planarizing the conductive metal layer so as to expose the first sacrificial layer 60. Before forming the contact pad 52, an oxide layer removing process or etching process may be additionally performed to remove a natural oxide layer formed on the surface of the bit line 20 exposed to the contact hole 54.

Figure 13A:
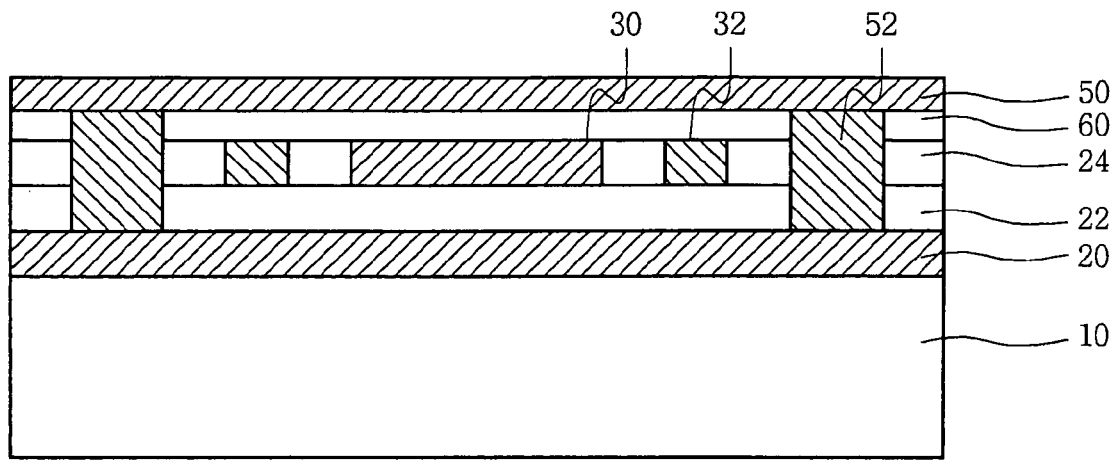
Figure 13B:
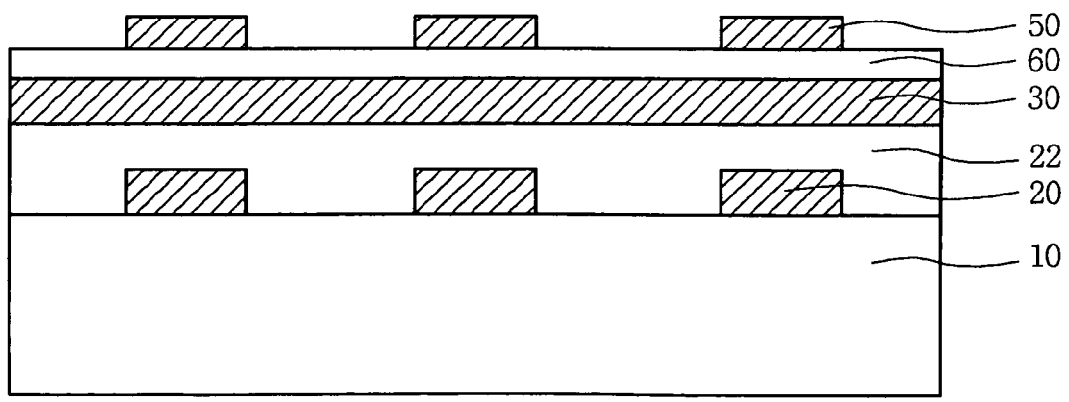

As shown in FIGS. 13A and 13B, a cantilever electrode 50 with a given line width may be formed on the contact pad 52 in the first direction as an upper part of the gate line 32 and the lower word line 30. The cantilever electrode 50 may have the same or similar line width to the contact pad 52, the bit line 20, and may be electrically connected to the bit line 20, thus known as an upper bit line. The upper bit line may be formed as the cantilever electrode 50 such that a node is divided by a trench 100 formed in a subsequent process. For example, a cantilever electrode layer may be formed of titanium, titanium nitride, or a carbon nanotube with a thickness of about 30 Å to about 50 Å via PVD, CVD or electrical discharge. A photoresist pattern or third hard mask layer (not shown) may be formed on the cantilever electrode layer. The cantilever electrode layer may be etched through the dry etching method that employs a photoresist pattern or third hard mask layer (not shown) as an etch mask, thereby forming the cantilever electrode 50. The photoresist pattern or third hard mask layer may be removed in etching the cantilever electrode layer.

In a method of manufacturing a multibit electro-mechanical memory device according to example embodiments, the cantilever electrode 50 electrically connected to the bit line 20 may be formed on the bit line 20 and the lower word line 30, which are isolated from each other by the first interlayer layer 22. Therefore, an integration level of memory devices may increase.

Figure 14A:
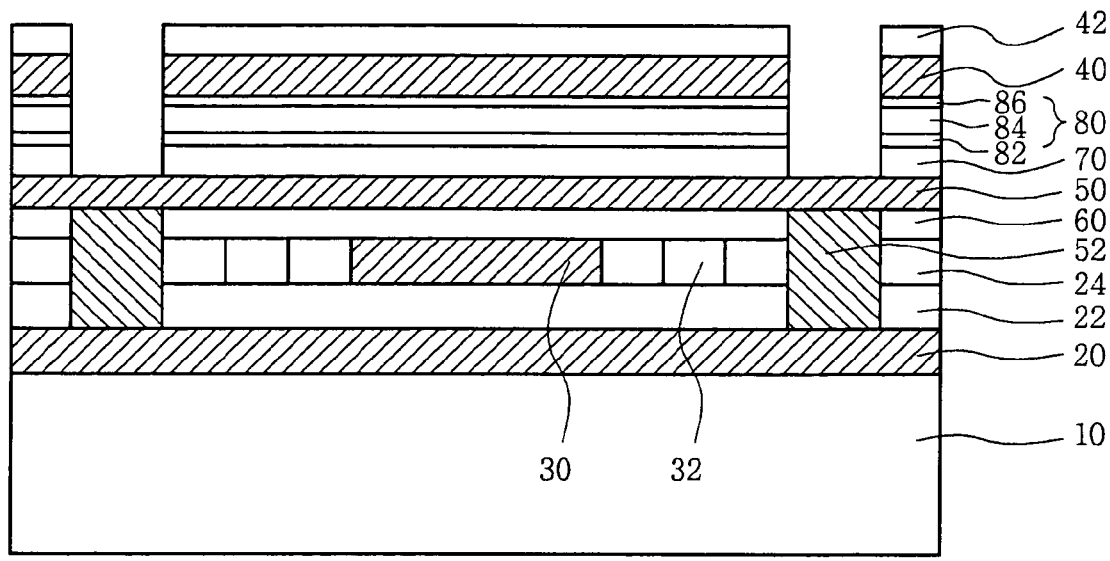
Figure 14B:
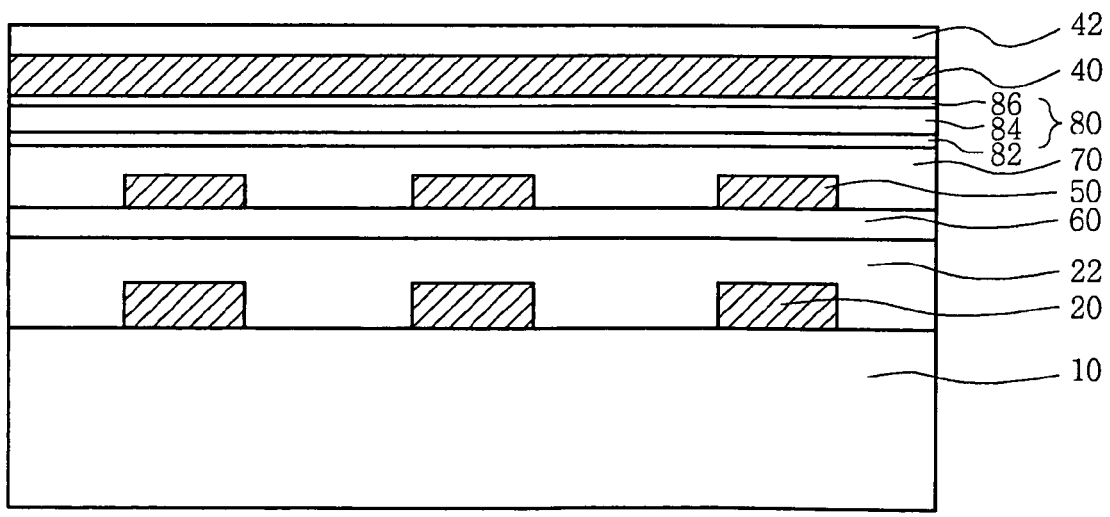

As shown in FIGS. 14A and 14B, a second sacrificial layer 70, a trap site 80 and an upper word line 40 may be formed on the cantilever electrode 50 in the second direction parallel with the gate line 32 and the lower word line 30. The second sacrificial layer 70, the trap site 80 and the upper word line 40 may be formed symmetrically to the first sacrificial layer 60 and the lower word line 30, interposing the cantilever electrode 50 therebetween. For example, the second sacrificial layer 70 may be formed of polysilicon material through atomic layer deposition or CVD, similar to the first sacrificial layer 60, and may have a thickness of about 50 Å to about 150 Å. Further, the trap site 80 may be formed via CVD including a first silicon oxide layer 82, a silicon nitride layer 84 and a second silicon oxide layer 86 with thicknesses of respectively about 100 Å, about 200 Å and about 100 Å. The upper word line 40 may be formed at a thickness of about 200 Å. The second sacrificial layer 70 and the upper word line 40 may be formed with each having a line width of about 50 Å to about 200 Å. The second sacrificial layer 70, the trap site 80 and the upper word line 40 may be formed as follows.

On the entire face of the substrate 10 where the cantilever electrode 50 has been formed, a polysilicon layer, the first silicon oxide layer 82, the silicon nitride layer 84, the second silicon oxide layer 86, a conductive metal layer and the fourth hard mask layer 42 may be sequentially stacked via CVD to each have a given thickness. A photoresist pattern may be formed on the fourth hard mask layer 42, and the fourth hard mask layer 42 may be etched via a dry or wet etching method that uses the photoresist pattern as an etch mask, and the photoresist pattern may be removed by an ashing process. Finally, the conductive metal layer, second silicon oxide layer 86, silicon nitride layer 84, first silicon oxide layer 82 and polysilicon layer may be sequentially etched aeolotropically via a dry or wet etching method that uses the fourth hard mask layer 42 as the etch mask, thereby forming the upper word line 40, trap site 80 and second sacrificial layer 70. In patterning the second sacrificial layer 70, trap site 80 and upper word line 40, the cantilever electrode 50 formed on the contact pad 52 may be exposed.

Consequently, in a multibit electro-mechanical memory device and method of manufacturing the same according to example embodiments, a stacked structure of the second sacrificial layer 70, trap site 80 and upper word line 40 on the cantilever electrode 50 may be formed, thereby increasing the integration of the memory device.

When void 94 obtained by removing the second sacrificial layer 70 is formed in a subsequent process in a lower part of the trap site 80 and upper word line 40 of the stack structure, the length of cantilever electrode 50 formed to be electrically switched within the void 94 may be reduced, thereby simply forming the cantilever electrode 50 of micro structure and increasing the yield.

Figure 15A:
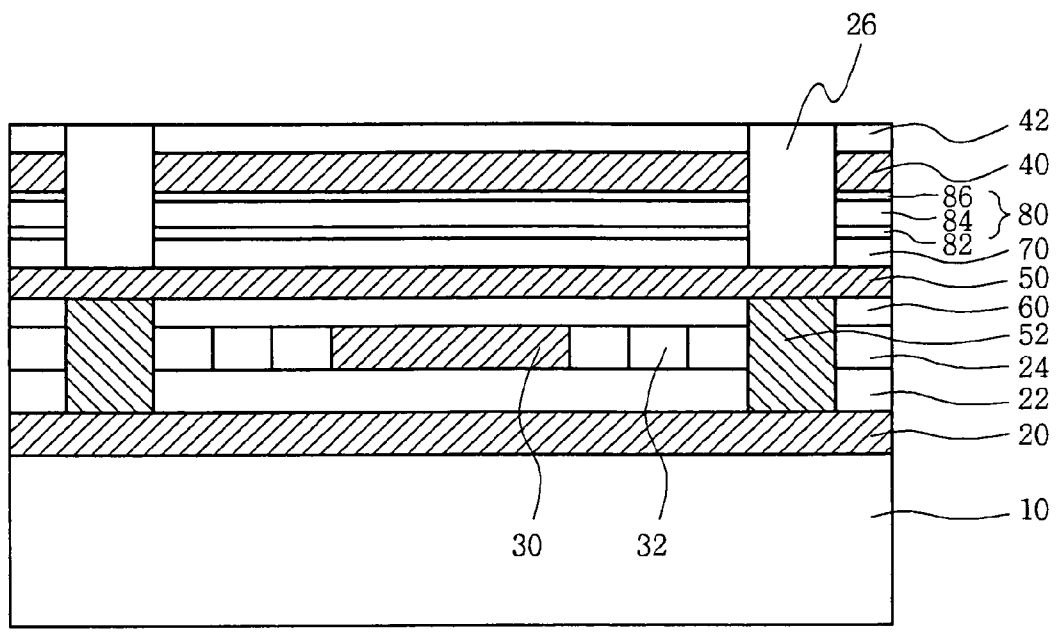
Figure 15B:
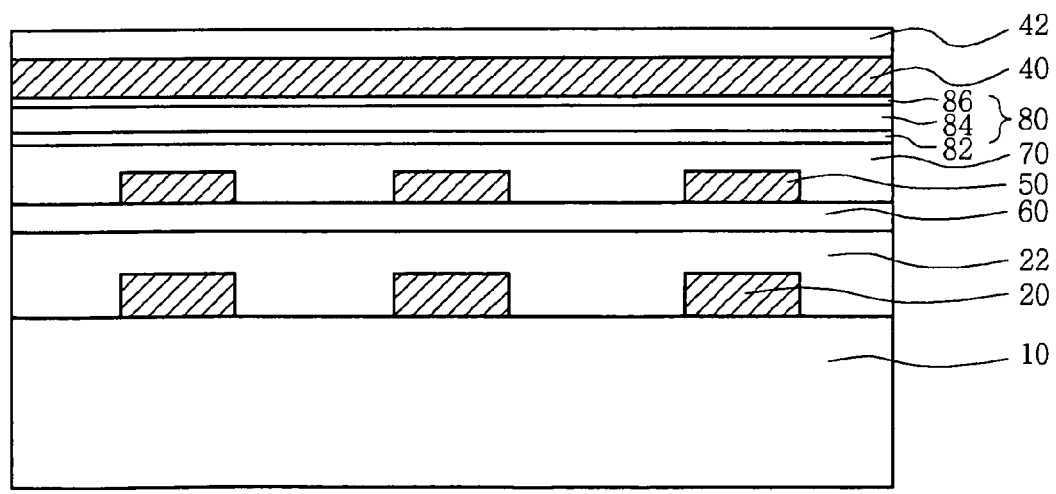

As shown in FIGS. 15A and 15B, a third interlayer insulating film 26 of a given thickness may be formed on the entire surface of the substrate on which the cantilever electrode 50 has been formed. The third interlayer insulating film 26 may be planarized to expose the fourth hard mask layer 42. The third interlayer insulating film 26 may have a similar or greater thickness than the second sacrificial layer 70, trap site 80 and upper word line 40. Thus, when the second sacrificial layer 70 is removed in a subsequent process, the third interlayer insulating film 26 may support a side face of the trap site 80 and the upper word line 40, thereby floating the trap site 80 and the upper word line 40 from the cantilever electrode 50. For example, the third interlayer insulating film 26 may be formed including a silicon oxide layer via plasma CVD. Further, the third interlayer insulating film 26 may be planarized via chemical mechanical polishing (CMP). When the third interlayer insulating film 26 is planarized by using the upper word line 40 as an etch stop layer, the upper word line 40 formed of a conductive metal layer may be damaged, and thus, the fourth hard mask layer 42 must be used as the etch stop layer. When the fourth hard mask layer 42 is excessively removed, in order to thicken the fourth hard mask layer 42, a silicon oxide layer or silicon nitride layer may be further formed on the fourth hard mask layer 42.

Figure 16A:
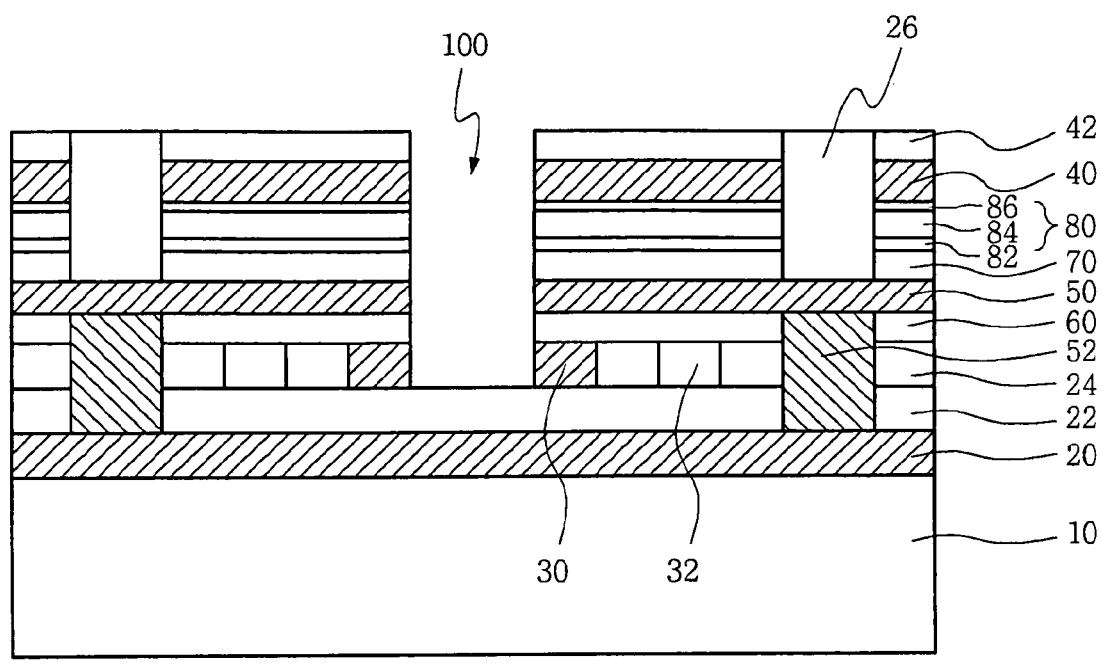
Figure 16B:
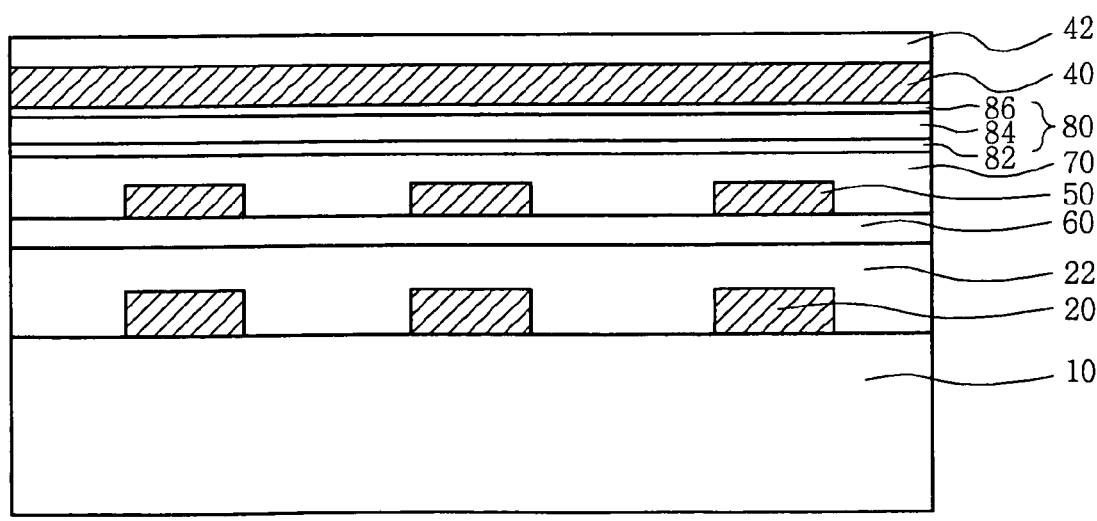

With reference to FIGS. 16A and 16B, the trench 100 may be formed creating symmetrical structures of the upper word line 40, trap site 80, second sacrificial layer 70, cantilever electrode 50, first sacrificial layer 60 and lower word line 30 in the first direction. The trench 100 may be formed to expose the first interlayer insulating film 22 in the second direction at the center between the plurality of contact pads 52. For example, the trench 100 may be formed as follows. The fourth hard mask layer 42 may be etched via the dry etching method that uses, as an etch mask, a photoresist pattern exposing a center of the fourth hard mask layer 42 formed on the upper word line 40, and the photoresist pattern may be removed. Via the dry etching method using the fourth hard mask layer 42 as an etch mask, the upper word line 40, trap site 80, second sacrificial layer 70, cantilever electrode 50, first sacrificial layer 60 and lower word line 30 may be sequentially removed, thereby forming the trench 100 exposing the first interlayer insulating film 22.

The trench 100 may be formed not only to separate a node of the cantilever electrode 50 but also to make it easier to remove the first and second sacrificial layers 60 and 70. For example, a reactive gas used for the dry etching method may be a gas including a $C_xF_y$ group or gas including a fluoridation carbon group, e.g., a $C_aH_bF_c$ group. The gas including the fluoridation carbon group may be $CF_4$, $CHF_3$, $C_2F_6$, $C_4F_8$, $CH_2F_2$, $CH_3F$, $CH_4$, $C_2H_2$, $C_4F_6$ or their mixture gas. The trench 100 may have a given line width to separate, symmetrically in the first direction, the upper word line 40, second sacrificial layer 70, cantilever electrode 50, first sacrificial layer 60 and lower word line 30. In a subsequent process, an etchant or reactive gas may flow into the trench 100 to isotropically eliminate the first and second sacrificial layers 60 and 70. The trench 100 may be formed herein with a line width of about 30 Å to 800 Å.

Figure 17A:
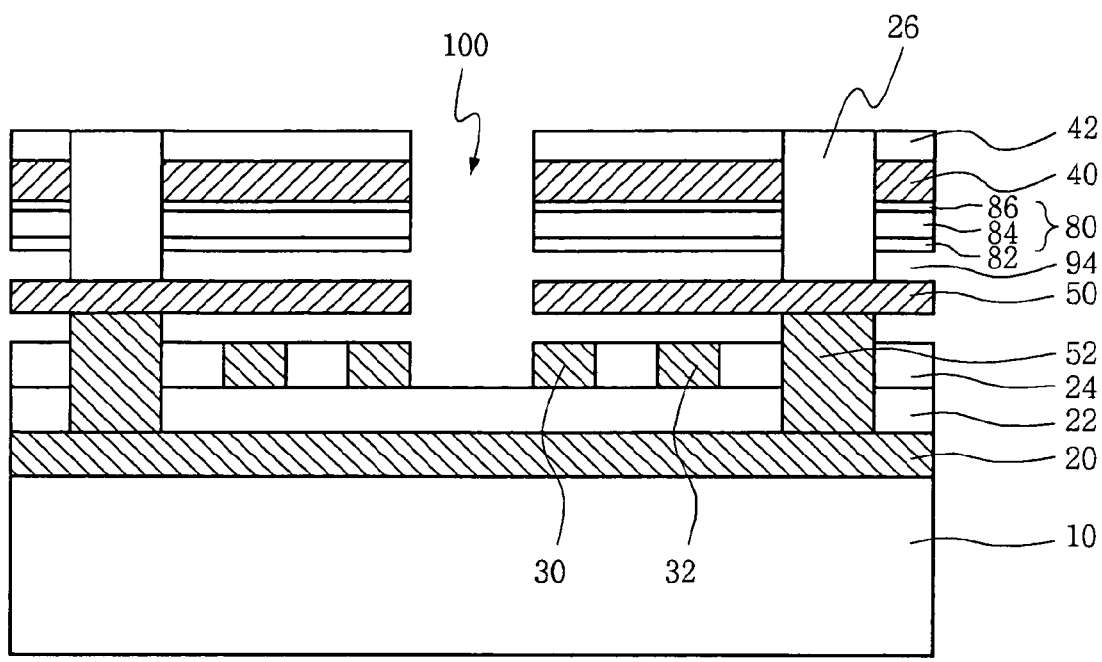
Figure 17B:
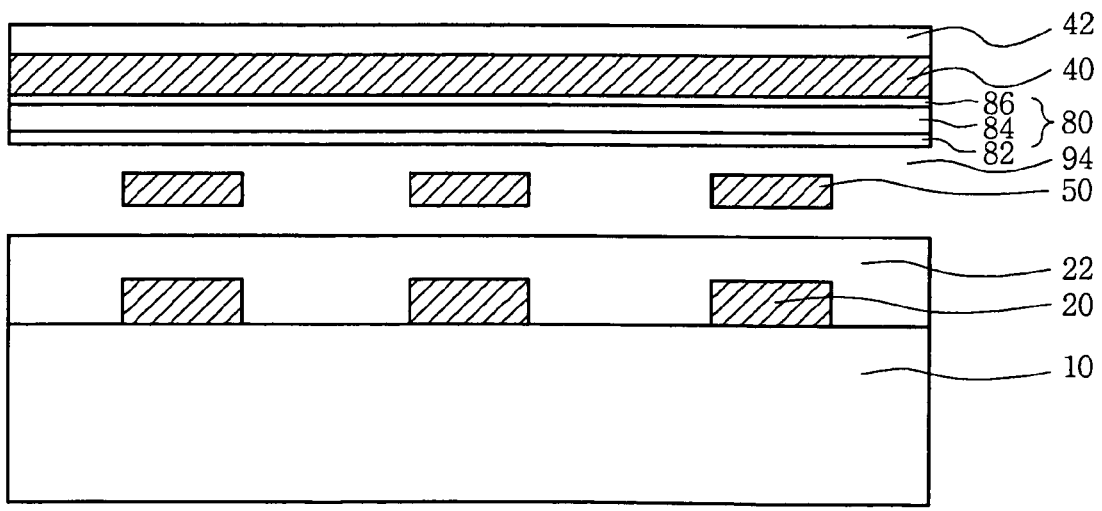

As shown in FIGS. 17A and 17B, the first sacrificial layer 60 and the second sacrificial layer 70 exposed to the trench 100 may be removed, thus forming a void 94 through which the cantilever electrode 50 floats between the lower word line 30 and the upper word line 40. For example, the first and second sacrificial layers 60 and 70 may be isotropically etched in a side direction from a side face thereof exposed to the trench 100 via the wet or dry etching method.

An etchant used for the wet etching method of the first and second sacrificial layers 60 and 70 formed of polysilicon material may be a mixture solution obtained by mixing a strong acid, e.g., nitric acid, HF and/or acetic acid, with deionized water by a given density. A reactive gas used for the dry etching method of the first and second sacrificial layers 60 and 70 may be a gas including a fluoridation carbon group, e.g., $CF_4$ or $CHF_3$. An etchant or etching gas used for the wet or dry etching method may horizontally eliminate the first sacrificial layer 60 and the second sacrificial layer 70 exposed to the trench 100, thereby forming the void 94 between the upper and lower word lines 40 and 30.

The void 94 may define a distance where the cantilever electrode 50 is curved and switched, and may be defined as a space between the trap site 80 and the lower word line 30. The trap site 80 may prevent or reduce the upper word line 40 from being damaged by an etching solution or gas flowing inside the trench 100 or from being recessed toward a lower part of the void 94 when forming the void 94.

In a method of manufacturing a multibit electro-mechanical memory device according to example embodiments, the first and second sacrificial layers 60 and 70 exposed to the trench 100 may be removed, and thus, the cantilever electrode 50 may be curved to perform an electrical switching operation within the void 94 between the trap site 80 and the lower word line 30.

Though not shown in these drawings, a fourth interlayer insulating film 110 covering an upper part of the trench 100 may be formed sealing up the inside of the trench 100. The void 94 of the trench 100 may be filled with a non-active gas, e.g., nitrogen in air or argon, and may have a vacuum state to increase a refractive speed of the cantilever electrode 50. For example, the fourth interlayer insulating film 110 may be formed of a polymer material that does not flow into the inside of the trench 100, but covers an upper part of the third interlayer insulating film 26 or the upper word line 40 formed on the trench 100. In addition, a memory device having a multilayer structure may be manufactured by sequentially forming another bit line 20, lower word line 30, cantilever electrode 50 and upper word line 40 on an upper part of the substrate 10 on which the fourth interlayer insulating film 110 has been formed.

Accordingly, a method of manufacturing a multibit electro-mechanical memory device according to example embodiments may form a memory device of multilayer structure in a vertical direction to the substrate 10 by using a fourth interlayer insulating film 110 that covers a plurality of memory units horizontally formed on the substrate 10, thereby increasing the integration of memory devices.

It will be apparent to those skilled in the art that modifications and variations may be made in example embodiments without deviating from the inventive spirit or scope. Thus, it may be intended that example embodiments cover any such modifications and variations of example embodiments provided they come within the scope of the appended claims and their equivalents. Accordingly, these and other changes and modifications may be seen to be within the inventive true spirit and scope as defined by the appended claims. In the drawings and specification, there may have been disclosed embodiments and, although specific terms may be employed, they may be used in a generic and descriptive sense only and not for limitation, the inventive scope being set forth in the following claims.

What is claimed is:

1. An electro-mechanical memory device, comprising:
   at least one bit line in a first direction on a substrate;
   at least one gate line and at least one lower word line in parallel by a given interval and in a second direction intersecting the first direction on the at least one bit line;
   at least one contact pad adjacent to the at least one gate line on the at least one bit line; and
   at least one cantilever electrode coupled to the at least one contact pad, configured to float with a void above and beneath the at least one cantilever electrode and configured to curve in a third direction vertical to the first and second directions,
wherein the at least one gate line includes a first gate line and a second gate line, and
wherein the first gate line and the second gate line are separated by a trench.

2. The device of claim 1, wherein the voids include a lower void above the first and second gate lines and the at least one lower word line, and an upper void above the at least one cantilever electrode, further comprising:
an interlayer insulating film between the at least one bit line, and the first and second gate lines and the at least one lower word line; and
at least one upper word line in the second direction above the at least one cantilever electrode.

3. The device of claim 2, further comprising:
at least one trap site formed between the at least one cantilever electrode and the at least one upper word line and configured to trap a charge in the at least one upper word line so as to electrically secure the at least one cantilever electrode curving upward in the direction of at least one upper word line.

4. The device of claim 3, wherein the at least one trap site has a stacked structure including a silicon oxide layer, a silicon nitride layer and a silicon oxide layer.

5. The device of claim 2, wherein the interlayer insulating film is a first interlayer insulating film,
the at least one lower word line includes first and second lower word lines separated by the trench, the first and second gate lines and the first and second lower word lines are symmetrical to each other and on the first interlayer insulating film,
the at least one contact pad includes first and second contact pads coupled to the at least one bit line adjacent to the first and second gate lines through contact holes formed in a second interlayer insulating film configured to electrically isolate the first and second gate lines from the first and second lower word lines,
the at least one cantilever electrode includes first and second cantilever electrodes, and
the at least one upper word line includes first and second upper word lines supported by a third interlayer insulating film on the first and second contact pads.

6. The device of claim 5, further comprising:
first and second trap sites formed between the first cantilever electrode and the first upper word line and between the second cantilever electrode and the second upper word line, respectively, and configured to trap a charge in the first and second upper word lines so as to electrically secure the first and second cantilever electrodes curving upward in the direction of the first and second upper word lines.

7. The device of claim 5, wherein the second interlayer insulating film is etched to form spacers insulating the first gate line from the first lower word line, and the second gate line from the second lower word line.

8. The device of claim 5, wherein the first and second cantilever electrodes include titanium, titanium nitride or carbon nanotube material.

9. The device of claim 6, wherein the trench forms a symmetrical structure of the first and second upper word lines, first and second trap sites, first and second cantilever electrodes and first and second lower word lines.

10. The device of claim 5, further comprising:
a fourth interlayer insulating film covering the first and second upper word lines and the trench.

11. A method of fabricating an electro-mechanical memory device, comprising:
forming a bit line on a substrate in a first direction;
forming first and second gate lines and a lower word line in parallel by a given interval over the bit line in a second direction, the second direction intersecting the first direction, the first and second gate lines being separated by a trench;
forming a first sacrificial layer on the first and second gate lines and the lower word line;
forming a contact hole by removing the first sacrificial layer;
forming a contact pad within the contact hole;
forming a cantilever electrode coupled to the contact pad; and
forming a second sacrificial layer, trap site and upper word line in the second direction on the cantilever electrode; and
producing a void in upper and lower parts of the cantilever electrode by removing the first and second sacrificial layers.

12. The method of claim 11, further comprising:
forming a first interlayer insulating film on the bit line; and
forming a second interlayer insulating film electrically isolating a side face of the first and second gate lines and the lower word line on the first interlayer insulating film.

13. The method of claim 12, further comprising:
planarizing the second interlayer insulating film using a hard mask layer as an etch stop layer, wherein the hard mask layer is used in forming the first and second gate lines and the lower word line.

14. The method of claim 11, wherein:
the forming of the first and second gate lines and the lower word line includes,
forming a second interlayer insulating film over the bit line in the second direction,
forming grooves in the second interlayer insulating film, and
forming the first and second gate lines and the lower word line within the grooves.

15. The method of claim 12, further comprising:
forming a third interlayer insulating film adjacent to a sidewall of the second sacrificial layer, the trap site and the upper word line.

16. The method of claim 12, further comprising:
forming the trench exposing the first interlayer insulating film from the bottom thereof by removing in the second direction, the center of the upper word line, trap site, second sacrificial layer, cantilever electrode, first sacrificial layer and lower word line.

17. The method of claim 12, further comprising:
forming a fourth interlayer insulating film covering the upper part of the upper word line and the trench.

18. A method of fabricating a multibit electro-mechanical memory device, comprising:
forming a bit line on a substrate in a first direction;
forming a first interlayer insulating film on the bit line;
forming first and second gate lines, a lower word line, and a second interlayer insulating film on the first interlayer insulating film in a second direction, wherein the first and second gate lines and the lower word line are in parallel by a given interval and in a second direction intersecting the first direction on the bit line;
forming a first sacrificial layer on the substrate;
forming a contact hole by removing the first sacrificial layer formed on the bit line intersecting the second interlayer insulating film adjacent to the first and second gate lines, the second interlayer insulating film and the first interlayer insulating film;

forming a contact pad within the contact hole;

forming a cantilever electrode on the contact pad in the first direction;

forming a second sacrificial layer, a trap site and an upper word line on the cantilever electrode in the second direction;

forming a third interlayer insulating film in a sidewall of the second sacrificial layer, the trap site and the upper word line;

forming a trench by removing the center of the upper word line, trap site, second sacrificial layer, cantilever electrode, first sacrificial layer and lower word line, the first and second gate lines being separated by the trench; and forming a void by removing the first and second sacrificial layers.

19. The method of claim 18, wherein:

the forming of the first and second gate lines, the lower word line, and the second insulating film includes forming a metal layer on the first interlayer insulating film, forming grooves in the metal layer to form the first and second gate lines and the lower word line, and forming the second interlayer insulating film within the grooves, or includes forming the second interlayer insulating film, forming grooves in the second interlayer insulating film, and forming the first and second gate lines and the lower word line within the grooves.

20. The method of claim 18, further comprising:

forming a fourth interlayer insulating film covering the upper part of the upper word line and the trench.

* * * * *